United States Patent
Then et al.

(10) Patent No.: US 10,263,074 B2
(45) Date of Patent: Apr. 16, 2019

(54) HIGH VOLTAGE FIELD EFFECT TRANSISTORS

(71) Applicant: Intel Corporation, Santa Clara, CA (US)

(72) Inventors: Han Wui Then, Portland, OR (US); Robert Chau, Beaverton, OR (US); Benjamin Chu-Kung, Portland, OR (US); Gilbert Dewey, Hillsboro, OR (US); Jack Kavalieros, Portland, OR (US); Matthew Metz, Portland, OR (US); Niloy Mukherjee, Portland, OR (US); Ravi Pillarisetty, Portland, OR (US); Marko Radosavljevic, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/605,795

(22) Filed: May 25, 2017

(65) Prior Publication Data
US 2017/0263708 A1   Sep. 14, 2017

Related U.S. Application Data

(60) Continuation of application No. 14/946,718, filed on Nov. 19, 2015, now Pat. No. 9,685,508, which is a
(Continued)

(51) Int. Cl.
*H01L 29/06* (2006.01)
*H01L 29/66* (2006.01)
(Continued)

(52) U.S. Cl.
CPC .......... *H01L 29/0673* (2013.01); *B82Y 10/00* (2013.01); *G05F 3/02* (2013.01);
(Continued)

(58) Field of Classification Search
CPC ............... H01L 29/0673; H01L 29/068; H01L 29/0676; H01L 29/2003; H01L 29/66469;
(Continued)

(56) References Cited

U.S. PATENT DOCUMENTS 6,921,700 B2   7/2005   Orlowski et al.
7,791,108 B2   9/2010   Hurkx et al.
(Continued)

FOREIGN PATENT DOCUMENTS

CN   101894842 A   11/2010
EP   2267782 A2   12/2010
(Continued)

OTHER PUBLICATIONS

Notice of Allowance from the Korean Intellectual Property Office (KIPO) dated Jun. 9, 2017 for Korean Patent Application No. 10-2016-7032820 (3 pages).
(Continued)

*Primary Examiner* — Victoria K. Hall
(74) *Attorney, Agent, or Firm* — Schwabe, Williamson & Wyatt, P.C.

(57) ABSTRACT

Transistors suitable for high voltage and high frequency operation are disclosed. A nanowire is disposed vertically or horizontally on a substrate. A longitudinal length of the nanowire is defined into a channel region of a first semiconductor material, a source region electrically coupled with a first end of the channel region, a drain region electrically coupled with a second end of the channel region, and an extrinsic drain region disposed between the channel region and drain region. The extrinsic drain region has a wider bandgap than that of the first semiconductor. A gate stack including a gate conductor and a gate insulator coaxially
(Continued)

wraps completely around the channel region, drain and source contacts similarly coaxially wrap completely around the drain and source regions.

25 Claims, 10 Drawing Sheets

Related U.S. Application Data division of application No. 13/976,414, filed as application No. PCT/US2011/065916 on Dec. 19, 2011, now Pat. No. 9,245,989.

(51) Int. Cl.

| | |
|---|---|
| H01L 29/775 | (2006.01) |
| G05F 3/02 | (2006.01) |
| H01L 29/786 | (2006.01) |
| B82Y 10/00 | (2011.01) |
| H01L 21/02 | (2006.01) |
| H01L 21/225 | (2006.01) |
| H01L 21/283 | (2006.01) |
| H01L 21/306 | (2006.01) |
| H01L 21/31 | (2006.01) |
| H01L 21/311 | (2006.01) |
| H01L 21/3213 | (2006.01) |
| H01L 21/324 | (2006.01) |
| H01L 29/04 | (2006.01) |
| H01L 29/417 | (2006.01) |
| H01L 29/423 | (2006.01) |
| H01L 29/20 | (2006.01) |

(52) U.S. Cl.
CPC .. *H01L 21/02603* (2013.01); *H01L 21/02636* (2013.01); *H01L 21/225* (2013.01); *H01L 21/283* (2013.01); *H01L 21/30604* (2013.01); *H01L 21/31* (2013.01); *H01L 21/31116* (2013.01); *H01L 21/324* (2013.01); *H01L 21/32133* (2013.01); *H01L 29/04* (2013.01); *H01L 29/41725* (2013.01); *H01L 29/42356* (2013.01); *H01L 29/42392* (2013.01); *H01L 29/66439* (2013.01); *H01L 29/66462* (2013.01); *H01L 29/66469* (2013.01); *H01L 29/775* (2013.01); *H01L 29/78696* (2013.01); *H01L 29/068* (2013.01); *H01L 29/0676* (2013.01); *H01L 29/2003* (2013.01)

(58) Field of Classification Search
CPC ......... H01L 29/78696; H01L 29/66462; H01L 29/41725; H01L 29/42356; H01L 29/04; H01L 29/775; H01L 29/66439; H01L 21/02636; H01L 21/30604; H01L 21/324; H01L 21/225; H01L 21/32133; H01L 21/31; H01L 21/31116; H01L 21/283; H01L 21/02603; G05F 3/02; B82Y 10/00
USPC ............... 257/24, E29.07; 977/762; 438/172
See application file for complete search history.

(56) References Cited

U.S. PATENT DOCUMENTS

| | | | |
|---|---|---|---|
| 8,084,308 B2 | 12/2011 | Chang et al. | |
| 8,896,066 B2 | 11/2014 | Glass et al. | |
| 9,240,410 B2* | 1/2016 | Then | H01L 29/66431 |
| 9,245,989 B2* | 1/2016 | Then | H01L 29/66469 |
| 9,373,693 B2 | 6/2016 | Then | |
| 9,397,188 B2 | 7/2016 | Then | |
| 9,685,508 B2* | 6/2017 | Then | H01L 29/66469 |
| 9,911,835 B2* | 3/2018 | Kotlyar | H01L 29/785 |
| 9,947,780 B2* | 4/2018 | Then | H01L 29/7787 |
| 2003/0132461 A1 | 7/2003 | Roesner et al. | |
| 2004/0075464 A1 | 4/2004 | Samuelson et al. | |
| 2004/0097023 A1 | 5/2004 | Park et al. | |
| 2004/0214401 A1* | 10/2004 | Krueger | H01L 23/3171 438/317 |
| 2006/0071275 A1 | 4/2006 | Brask et al. | |
| 2006/0202266 A1 | 9/2006 | Radosavljevic et al. | |
| 2007/0210374 A1 | 9/2007 | Wu | |
| 2007/0287259 A1 | 12/2007 | Kavalieros et al. | |
| 2008/0230853 A1 | 9/2008 | Jang et al. | |
| 2008/0246020 A1 | 10/2008 | Kawashima et al. | |
| 2009/0008631 A1* | 1/2009 | Hurkx | B82Y 10/00 257/25 |
| 2009/0032799 A1* | 2/2009 | Pan | H01L 33/24 257/13 |
| 2009/0035908 A1 | 2/2009 | Pribat et al. | |
| 2009/0194826 A1 | 8/2009 | Ernst et al. | |
| 2009/0242855 A1* | 10/2009 | Fleming | H01B 1/22 252/519.34 |
| 2009/0321716 A1* | 12/2009 | Wernersson | B82Y 10/00 257/24 |
| 2010/0059807 A1 | 3/2010 | Cho et al. | |
| 2010/0133509 A1 | 6/2010 | Kawashima et al. | |
| 2010/0200894 A1* | 8/2010 | Kurita | H01L 29/0817 257/191 |
| 2010/0203726 A1* | 8/2010 | Cramer | H01L 21/76898 438/667 |
| 2010/0213434 A1 | 8/2010 | Lee et al. | |
| 2010/0252800 A1 | 10/2010 | Chidambarrao et al. | |
| 2010/0252815 A1 | 10/2010 | Chidambarrao et al. | |
| 2010/0295021 A1 | 11/2010 | Chang et al. | |
| 2011/0233512 A1 | 9/2011 | Yang et al. | |
| 2016/0365456 A1 | 12/2016 | Liu et al. | |

FOREIGN PATENT DOCUMENTS

| | | |
|---|---|---|
| TW | 200735280 A | 9/2007 |
| WO | WO 2010/009873 A1 | 1/2010 |

OTHER PUBLICATIONS

Notice of Preliminary Rejection (Non-Final) from the Korean Intellectual Property Office (KIPO) for Korean Patent Application No. 10-2014-7017533 dated Jul. 28, 2015 and English Summary thereof.
Summary of Official Communication from the Taiwan Intellectual Property Office for Taiwan Patent Application No. 101142597 dated May 14, 2015 and English Summary thereof and English Translation of Search Report.
International Search Report and Written Opinion dated Mar. 23, 2012 for PCT/US2011/065914 filed Dec. 19, 2011, 11 pages.
First Office Action from the Chinese Patent Office dated May 3, 2016 for Chinese Patent Application No. 201180076395.8.
Notice of Preliminary Rejection from the Korean Intellectual Patent Office (KIPO) dated Feb. 4, 2016 for Korean Patent Application No. 10-2014-7017533 and Summary thereof.
Notice of Final Rejection (3 pages) from the Korean Intellectual Property Office (KIPO) dated Sep. 8, 2016 for Korean Patent Application No. 10-2014-7017533 and English Summary thereof (1 page).
Notice of Allowance from the Taiwan Patent Office dated Feb. 4, 2016 for Taiwan Patent Application No. 101142597 and English Translation thereof.
Notice of Allowance (3 pages) from the Korean Intellectual Property Office (KIPO) dated Oct. 14, 2016 for Korean Patent Application No. 10-2014-7017533.
International Search Report and Written Opinion dated Mar. 23, 2012 for PCT/US21011/065914 filed Dec. 19, 2011, 11 pages.
Official Letter including Search Report (3 pages) from the Taiwan Intellectual Property Office for Taiwan Patent Application No. 105103540 received Jan. 13, 2017 and English Summary (1 page) thereof.

(56) References Cited

OTHER PUBLICATIONS

Second Office Action from the Chinese Patent Office for Chinese Patent Application No. 201180076395.8 dated Feb. 6, 2017.
Preliminary Rejection (Non-Final) (3 pages) dated Jan. 12, 2017 from the Korean Intellectual Property Office (KIPO) for Korean Patent Application 10-2016-7032820 and English Summary (1 page) thereof.
Machine translation, Office Action, State Intellectual Property Office (People's Republic of China), Application No. CN 20110076395.8, dated Feb. 6, 2017 (translation data: May 20, 2017), Global Dossier, all pages.
Machine translation, Office Action, Korean Intellectual Property Office, Application No. KR 10-2016-7032820, dated Feb. 2, 2017 (translation date: May 20, 2017), Global Dossier, all pages.

* cited by examiner

HIGH VOLTAGE FIELD EFFECT TRANSISTORS

CROSS REFERENCE TO PATENT APPLICATIONS

This patent application is a Continuation of application Ser. No. 14/946,718 filed Nov. 19, 2015, which is a Divisional of U.S. application Ser. No. 13/976,414 filed Jun. 26, 2013, now U.S. Pat. No. 9,245,989, which is a U.S. National Phase Application under 35 U.S.C. 371 of International Application No. PCT/US2011/065916 filed Dec. 19, 2011.

TECHNICAL FIELD

Embodiments of the present invention generally relate to microelectronic devices and fabrication, and more particularly to high voltage field effect transistors (FETs).

BACKGROUND

Systems on a chip (SOC) have been implemented in a number of capacities over the last few decades. SOC solutions offer the advantage of scaling which cannot be matched by board-level component integration. While analog and digital circuits have long been integrated onto a same substrate to provide a form of SOC that provides mixed signal capabilities, SOC solutions for mobile computing platforms, such as smart phones and tablets, remain elusive because these devices typically include components which operate with one or more of high voltage, high power, and high frequency. As such, conventional mobile computing platforms typically utilize group III-V compound semiconductors, such a GaAs heterojunction bipolar transistors (HBTs), to generate sufficient power amplification at GHz carrier frequencies and laterally diffused silicon MOS (LDMOS) technology to manage voltage conversion and power distribution (battery voltage regulation including step-up and/or step-down voltage conversion, etc.). Conventional silicon field effect transistors implementing CMOS technology then entail a third device technology utilized for logic and control functions within a mobile computing platform.

The plurality of transistor technologies utilized in a mobile computing platform limits scalability of the device as a whole and is therefore a barrier to greater functionality, higher levels of integration, lower costs, smaller form factors, etc. While an SOC solution for the mobile computing space that would integrate at two or more of these three device technologies is therefore attractive, one barrier to an SOC solution is the lack of a transistor technology having both a low Specific On Resistance ($R_{on}$), and a sufficiently high breakdown voltage (BV) (i.e., largest drain-to-source voltage YDS, a transistor can sustain before the advent of breakdown via avalanche and/or band-to-band tunneling at the drain-to-gate region).

Trade-offs in high voltage planar FETs can generally be shown in FIG. 1A, plotting $R_{on}$ vs. BV. Baliga's limit is shown for various materials that form the plane on which a planar FET is fabricated. As can be seen from FIG. 1A, choosing a high mobility material to improve $R_{on}$ typically results in a reduced BV because most high carrier mobility materials, such as InAs, have a low intrinsic breakdown field. The intrinsic breakdown field is a function of the bandgap of the semiconductor, such that a high mobility material, like InAs (~25,000 cm$^2$/V-s) having an energy gap of only 0.36 eV, has an intrinsic breakdown field of only 0.04 MV/cm. A high bandgap semiconductor, such as GaN ($E_g$=3.18 eV), while having a high intrinsic breakdown field of 3.3 MV/cm, has a lower mobility of approximately 2000 cm$^2$/V-s, or less. For a given bandgap, the breakdown voltage of a transistor is a function of the gate-to-drain separation, $L_{gd}$, as shown in the cross-sectional view of FIG. 1B illustrating a typical planar high voltage FET with a lightly doped drain-to-gate region $L_{gd}$ (e.g., an LDMOS device).

Referring further to FIG. 1B, the $R_{on}$ limit is the lowest ON-state resistance that a transistor can achieve at a given BV and the lower the $R_{on}$, the more advantageous the transistor because power dissipation is reduced, a larger drive current can be provided, and higher $F_{max}$ (i.e., unity power gain frequency, or maximum oscillation). $R_{on}$ includes the source and drain contact resistances ($R_{cc}$), channel resistance ($R_{ch}$), and the drain-to-gate drift resistance ($R_{drift}$), as illustrated in FIG. 1B. While $R_{drift}$ dominates at large voltages, at lower voltages (e.g., <100V), $R_{cc}$ and $R_{ch}$ become more comparable to $R_{drift}$. Hence, a device that has a reduced $R_{ch}$ for a given channel length can get closer to Baliga's limit for a given material as long as desirable breakdown characteristics are maintained. Such a device would therefore be highly advantageous for many circuit applications, particularly a SOC solution which integrates the RF integrated circuit (RFIC) and/or power management integrated circuit (PMIC) with the logic and control functions within a mobile computing platform.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1A:
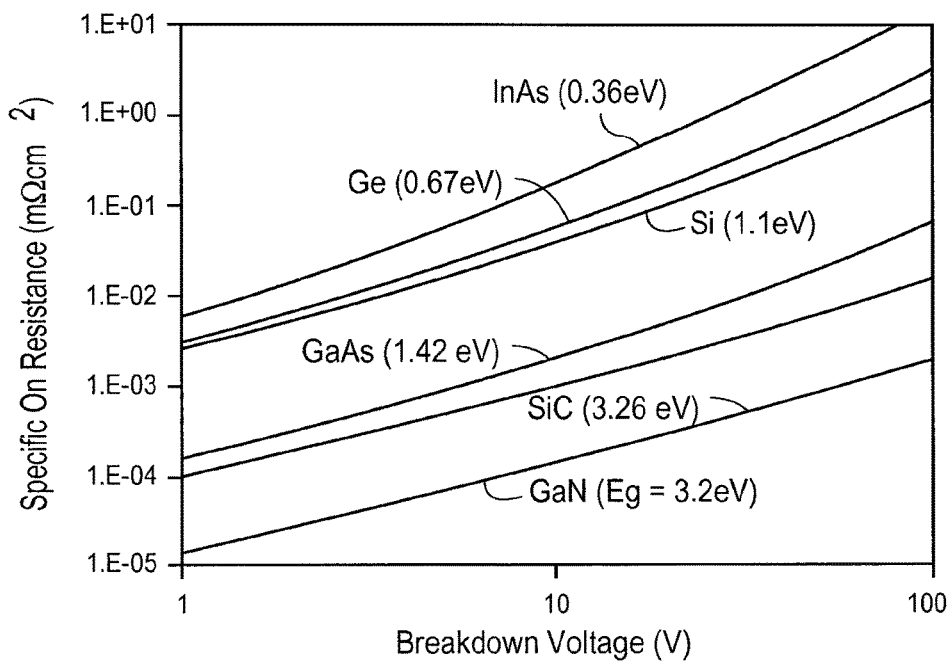
FIG. 1A is a graph of BV vs. Specific On Resistance for various semiconductor materials.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are embodiments of semiconductor devices and fabrication techniques to reduce the channel resistance, $R_{ch}$, by employing a first semiconductor material having a high mobility in a channel region, while providing a high BV through further incorporation of a second semiconductor material having a higher bandgap in an extrinsic drain region between the device channel and the drain contact. In the exemplary embodiments, gate structures wrap around all sides of the channel region to form what is referred to herein as a nanowire. Both horizontal and vertical nanowire structures are illustrated as alternate embodiments to succinctly demonstrate the broad application of the present invention in the context of non-planar embodiments. It is further noted however, that planar devices may similarly employ first and second semiconductor materials to achieve at least some of the described benefits in $R_{ch}$ and BV. It should therefore be appreciated that planar implementations of one or more of the techniques described herein in the context of nanowire devices may be readily achieved by a skilled artisan.

Figure 2A:
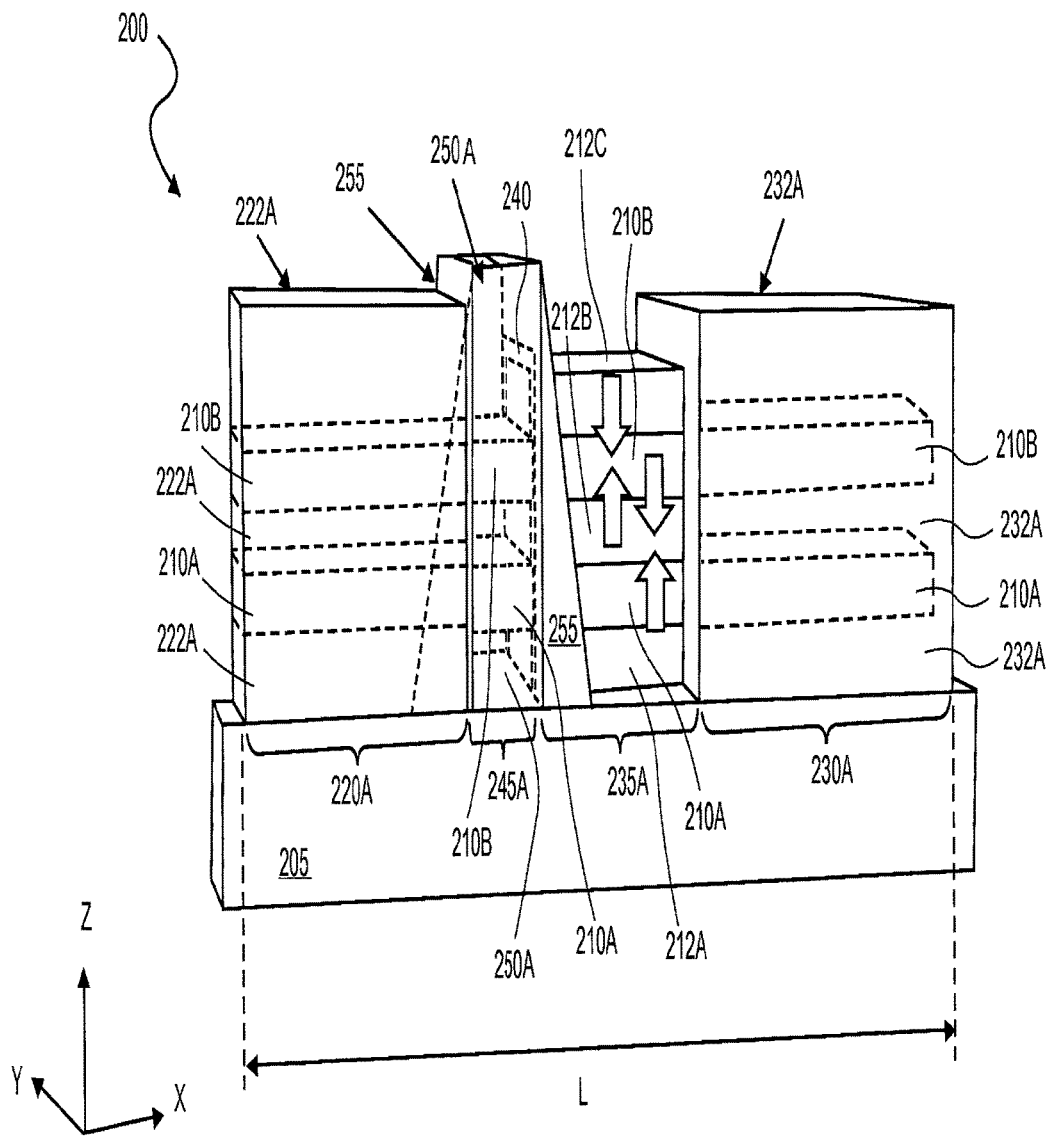
FIG. 2A is an isometric illustration of a non-planar high voltage transistor, in accordance with an embodiment.

FIG. 2A is an isometric illustration of a non-planar high voltage transistor 200, in accordance with an embodiment. Generally, the high voltage transistor 200 may be of any minority or majority carrier gate voltage controlled device, such as, but not limited to, a metal oxide semiconductor field effect transistor (MOSFET), or a high electron mobility transistor (HEMT). Therefore, while the exemplary embodiment illustrated in FIG. 2A is a HEMT, modifications to the high voltage transistor 200 known in the art may be performed to implement a MOSFET sharing relevant properties with the exemplary HEMT embodiment. Similarly, other known gate voltage controlled devices may also be implemented without departing from the scope of the invention.

The high voltage transistor 200 includes at least one non-planar crystalline semiconductor body that is on a plane parallel to a top surface of a substrate layer 205 but physically separated from the top substrate surface by an intervening material other than the crystalline semiconductor forming the body or the material forming the substrate layer 205 to form a laterally oriented nanowire 210A. For the embodiments described herein, the transverse cross-sectional geometry of the nanowire may vary considerably from circular to rectangular such that the thickness of the nanowire 210A (i.e., in z dimension) may be approximately equal to a width of the nanowire 210A (i.e., in y dimension) or the thickness and width of the nanowire 210A may be significantly different from each other (i.e., physically akin to a ribbon, etc.) to form cylindrical and parallelepiped semiconductor bodies. For the exemplary embodiments, the narrowest width of the nanowire 210A is between 5 and 50 nanometers (nm).

As further illustrated in FIG. 2A, a longitudinal length L of the high voltage transistor 200 is divided between a source region 220A, a drain region 230A, an extrinsic drain region 235A, and a channel region 245A disposed there between. Along the longitudinal length L, a plurality of semiconductor materials of differing bandgaps are utilized within the channel region 245A and the extrinsic drain region 235A to achieve low $R_{on}$ and high BV. Although the semiconductor materials chosen for the channel and extrinsic drain regions 245A, 235A may vary with the implementation, the extrinsic drain region 235A is to include a semiconductor material of a higher bandgap than that of the channel region 245A. As described further herein, in certain embodiments, nanowire architecture and fabrication techniques are leveraged to incorporate a semiconductor that is sacrificial within the channel region 245A to selectively increase the bandgap of a first semiconductor material employed in the channel region 245A so that the extrinsic drain region 235A has greater resistance to field induced breakdown mechanisms. In other embodiments, nanowire architecture and fabrication techniques are leveraged to selectively replace at least the first semiconductor material employed in the channel region 245A with a regrown material of higher bandgap within the extrinsic drain region 235A. In still other embodiments, nanowire architecture and fabrication techniques are leveraged to form each of the channel region, extrinsic drain region, and even source region from separate semiconductor materials all having a common crystal structure and orientation (i.e., monocrystalline).

The high voltage transistor 200 is disposed on the substrate layer 205. In an embodiment, the substrate layer 205 is insulating or semi-insulating and/or has an insulating or semi-insulating layer disposed there on, over which the nanowire 210A is disposed. In one such embodiment, the substrate layer 205 is a top layer of semiconductor grown (depicted in FIG. 2A) on a support substrate or transferred onto a donor substrate (support and donor substrates not depicted). In a particular embodiment, the substrate layer 205 includes a silicon support substrate, upon which the semiconductor layer is epitaxially grown, however, the support substrate may also be of alternate materials, which may or may not be combined with silicon, including, but not limited to, germanium, indium antimonide, lead telluride, indium arsenide, indium phosphide, gallium arsenide, or gallium antimonide, carbon (SiC), and sapphire. In another embodiment, the substrate layer 205 upon which the transistor 200 is disposed is a dielectric layer, so that the substrate layer 205 is a buried oxide (BoX) which may be formed for example by transferring one or more layers of the semiconductor from which the nanowire 210A is formed onto the substrate layer 205.

Within the channel region 245A, the nanowire 210A has much greater long range order than a polycrystalline material. In the exemplary embodiment, the channel region 245A is substantially single crystalline though a low level of crystal defects may be present as artifacts of an imperfect epitaxial growth process. Within the channel region 245A, the nanowire 210A may be of one or more semiconducting elements forming an elemental semiconductor or compound semiconductor. Generally, the semiconductor material in the channel region 245A has a relative high carrier mobility. In embodiments, the channel region 245A is to be a substantially undoped semiconductor (i.e., impurity concentration minimized) for minimum impurity scattering. In a first exemplary HEMT embodiment, the channel region 245A consists essentially of indium nitride (InN). As compared to a GaN channel, $R_{on}$ can be reduced by as much as ~30% (where InN is also used in source and drain regions 220A, 230A) because of greater carrier mobility (2700 cm$^2$/Vs as compared to 1900 cm$^2$/Vs). In a second exemplary HEMT embodiment, the channel region 245A comprises any ternary alloys of InN or GaN, such as aluminum indium nitride ($Al_xIn_{1-x}N$) or aluminum gallium nitride ($Al_xGa_{1-x}N$), where x is less than 1. In third exemplary HEMT embodiment, the channel region 245A consists essentially of indium arsenide (InAs). In a fourth exemplary HEMT embodiment, the channel region consists essentially of GaAs. In a first exemplary MOSFET embodiment, the channel region 245A consists essentially of silicon (Si). In a second exemplary MOSFET embodiment, the channel region 245A consists essentially of germanium (Ge).

For HEMT embodiments, within at least the channel region 245A, the nanowire 210A is covered with a crystalline semiconductor layer 240 disposed over one or more of the sidewalls, top, and/or bottom surfaces of the nanowire 210A. In the exemplary embodiment, the crystalline semiconductor layer 240 is disposed directly on the nanowire 210A. The crystalline semiconductor layer 240 is of a material having a wider bandgap than that of the first semiconductor material utilized in the nanowire 210A within the channel region 245A so as to form a heterointerface within the channel region 245A. For example in an embodiment where the channel region 245 is GaN, the crystalline semiconductor layer 240 is AlN, AlInN or AlInGaN. Preferably, the crystalline semiconductor layer 240 is substantially monocrystalline (i.e., having a thickness below the critical thickness) and lattice matched to semiconductor material utilized in the nanowire 210A within the channel region 245A. In one advantageous embodiment, the crystalline semiconductor layer 240 disposed on the nanowire 210A is the second semiconductor material utilized in the extrinsic drain region 235A (e.g., 212A), although thinner to permit a complete wrapping around of the gate stack 250A. In the exemplary embodiment, the crystalline semiconductor layer 240 is a charge inducing layer formed on the walls of the nanowire 210A such that a two-dimension electron gas (2DEG) may be formed adjacent to a wall. The crystalline semiconductor layer 240 may further serve as a back barrier as deposited on an opposing wall of the nanowire 210A. In alternative embodiments, the crystalline semiconductor layer 240 is formed on the top and bottom of the nanowires 210A such that a two-dimension electron gas (2DEG) may be formed adjacent to a top surface and a back barrier adjacent to a bottom surface. Both back barrier and charge inducing layer may be gated by the gate stack 250A. As further illustrated in FIG. 2A, the crystalline semiconductor layer 240 also covers the semiconductor within the extrinsic drain region 235A. Within the extrinsic drain region 235A the crystalline semiconductor layer 240 serves as a charge inducing layer.

As further illustrated in FIG. 2A by the dashed lines within the channel region 245A, a gate stack 250A including a gate insulator and a gate conductor coaxially wraps completely around the nanowire 210 to modulate the channel region 245A. The gate stack 250A includes a gate conductor electrically isolated from the nanowire 210A by a gate dielectric material disposed under the gate conductor to reduce leakage current between the gate conductor and the nanowire 210A. Generally, the gate dielectric material may include one or more of any material known in the art for FET gate dielectrics, and is preferably a high K dielectric (i.e., having a dielectric constant greater than that of silicon nitride ($Si_3N_4$)), such as, but not limited to, high K oxides like gadolinium oxide ($Gd_2O_3$), hafnium oxide ($HfO_2$), high K silicates such as HfSiO, TaSiO, AlSiO, and high K nitrides such as HfON. In embodiments the gate stack 250A includes a conductive gate (electrode) material layer along all perimeter surfaces (sidewalls, top and bottom) of the nanowire 210A within the channel region 245A. Generally, the gate conductor may be of any material known in the art for transistor gate electrodes. In an embodiment, the gate conductor includes a work function metal which may be selected to obtain a desired threshold voltage ($V_t$) (e.g., greater than 0V, etc). Exemplary conductive gate materials include, tungsten (W), aluminum (Al), titanium (Ti), tantalum(Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

The nanowire 210A further includes a source region 220A embedded within a source contact 222A that coaxially wraps completely around the nanowire 210A within the source region 220A. In certain embodiments, the nanowire 210A within the source region 220A maintains the same moncrystallinity as within the channel region 245A. In the exemplary embodiment, within the source region 220A, the nanowire 210A includes at least the same high mobility, narrow bandgap semiconductor material present in the channel region 245A, for example, InN in the first exemplary HEMT embodiment and Si in the first exemplary MOSFET embodiment. However, the semiconductor within the source region 220A may further include a concentration of dopant, such as an n-type impurity (i.e., N+). The source contact 222A wraps coaxially around the nanowire 210A within the source region 220A to fill in a gap between the nanowire 210A and the substrate layer 205. In an embodiment, the source contact 222A includes a metallization layer. The source contact 222A may further include an epitaxially grown semiconductor of different composition than the nanowire 210A. Such semiconductor may be for the sake of minimizing contact resistance to an ohmic metallization or to provide a tunnel junction (e.g., a p+ layer wrapping around the nanowire 210A within the source region 220A). Ultra steep turn on and off (i.e., improved subthreshold performance) may be provided with such a tunnel junction for reduced off state leakage current.

The nanowire 210A further includes a drain region 230A embedded within a drain contact 232A coaxially wrapping completely around the nanowire 210A within the drain region 230A. In certain embodiments, the nanowire 210A within the drain region 230A maintains the same monocrystallinity as within the channel region 245A. In the exemplary embodiment, within the drain region 230A, the nanowire 210A includes at least the same high mobility, narrow bandgap semiconductor material present in the channel region 245A (e.g., InN in the first exemplary HEMT embodiment and Si in the first exemplary MOSFET embodiment). However, the semiconductor within the drain region 230A may further include high concentration of dopant, just as within the source region 220A, such as an n-type impurity (i.e., N+). The drain contact 232A wraps coaxially around the nanowire 210A within the drain region 230A to fill in a gap between the nanowire 210A and the substrate layer 205. Like the source contact 222A, embodiments of the drain contact 232A include a metallization layer and may also further include an epitaxially grown semiconductor of different composition than the nanowire 210A.

Figure 1B:
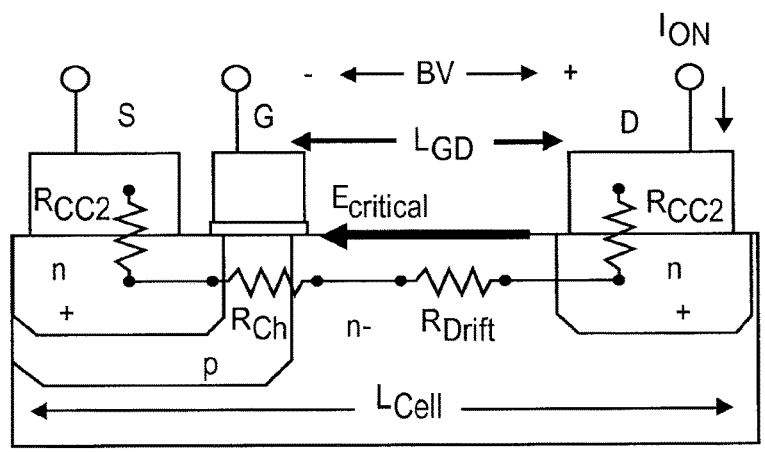
FIG. 1B is a cross-sectional view of a typical planar high voltage FET with a lightly doped drain-to-gate region.

As shown in FIG. 2A, the source contact 222A is spaced apart from the channel region 245A by a first longitudinal length corresponding to a thickness of a dielectric spacer 255 isolating the gate conductor in the gate stack 250A from the source contact 222A. The drain contact 232A is spaced apart from the channel region 245A by a second longitudinal length, corresponding to the extrinsic drain region 235A. The longitudinal length of the extrinsic drain region 235A is a function of the BV desired as it functionally corresponds to $L_{gd}$ illustrated in FIG. 1B. While in some embodiments, the extrinsic drain region 235A may only have a longitudinal length of the spacer 255, advantageously higher BV can be achieved when the extrinsic drain region 235A has a longitudinal length that is greater than the spacing between the source contact 222A and the channel region 245A.

The extrinsic drain region 235A includes a second semiconductor material having a wider bandgap than that of the first semiconductor. In embodiments, this second semiconductor material is absent from at least the channel region 245A, and in the exemplary embodiment, is also absent from the source and drain regions 220A, 230A. The second semiconductor material within the extrinsic drain region 235A may vary depending on the material utilized for the nanowire 210A within the channel region 245A. For the exemplary embodiment with a channel region of InN, the extrinsic drain region 235A includes a second semiconductor material of GaN. With an extrinsic drain region 235A including GaN, a BV of 10V, or more, is achievable at small $L_{gd}$ dimensions. For the exemplary embodiment with a channel region of GaAs, the extrinsic drain region 235A includes a second semiconductor material of AlGaAs. For the exemplary embodiment with a channel region of InAs, the extrinsic drain region 235A includes a second semiconductor material of InAlAs. For the exemplary embodiment with a channel region of Ge, the extrinsic drain region 235A includes a second semiconductor material of SiGe, Si, or a III-V material. For the exemplary embodiment with a channel region of Si, the extrinsic drain region 235A includes a second semiconductor material of SiC. With a Si channel, $R_{on}$ can be reduced by as much as ~99% (vs. SiC) because of the greater carrier mobility (1350 $cm^2$/Vs as compared to 140 $cm^2$/Vs), however a 10V BV can still be attained with SiC utilized in the extrinsic drain region 235A. In further embodiments, one or more of the semiconductor materials within the extrinsic drain region 235A is lightly doped with an impurity (e.g., n-type).

In one exemplary embodiment, the extrinsic drain region 235A is an alloy of the first and second semiconductor materials to provide a bandgap intermediate between to those of the first and second semiconductor materials. As illustrated by the open arrows in FIG. 2A, within the extrinsic drain region 235A, the alloy of the first and second semiconductor materials is in the form of a disordered multilayer structure. The multilayer structure includes the narrow bandgap first semiconductor material of the nanowire 210A, extending through the extrinsic drain region 235A and coupling the channel region 245A to the drain region 230A, sandwiched between opposing layers of the wider bandgap second semiconductor material 212A and 212B. With opposing sides of the nanowire 210A adjacent to the second semiconductor material 212A and 212B, good alloy uniformity may be achieved within the portion of the extrinsic drain region 235A physically coupled to the channel and drain regions 245A, 230A of the nanowire 210A. Notably, while a semiconductor body need only be undercut to form the nanowire 210A, to achieve the illustrated multilayered structure within the extrinsic drain region 235A, the second semiconductor material 212B is to further be present only in the extrinsic drain region 235A (i.e., absent from the channel region 245A). Therefore, because of the second semiconductor material 212B, a top surface of the extrinsic drain region 235A is elevated from the substrate layer 205 to a greater height than is a top surface of the nanowire 210A.

In an embodiment, as shown in FIG. 2A, the high voltage transistor 200 includes a vertical stack of nanowires 210A and 210B to achieve a greater current carrying capability (e.g., larger drive currents) for a given footprint over the substrate layer 205. Any number of nanowires 210 may be vertically stacked, depending on fabrication limitations, with the longitudinal axis of each of the nanowire substantially parallel to a top surface of the substrate layer 205. In the exemplary embodiment, each of the nanowires 210A, 210B is of the same first semiconductor material within the channel region 245A. In further embodiments, each of the nanowires 210A and 210B is coaxially wrapped by the gate stack 250A. In the exemplary embodiment, at least the gate dielectric layer of the gate stack 250A is to be disposed between the nanowires 210A and 210B, but preferably the gate conductor is also present between the channel regions of each of the nanowires 210A, 210B.

In the illustrated embodiment, each of the plurality of nanowires 210A, 210B are physically coupled together by semiconductor material in the extrinsic drain region 235A. In the exemplary embodiment, the second semiconductor material 212B physically joins the nanowires 210A and 210B with the second semiconductor material 212C then further disposed over the second nanowire 210B to maintain the multi-layered structure within the extrinsic drain region 235A and the semiconductor within extrinsic drain region 235A again having a greater physical height (z-dimension) than that within the channel region 245A. For embodiments including a plurality of nanowires 210A, 210B, the high voltage transistor 200 within the drain region has a plurality of drain regions, one for each nanowire within the vertical stack of nanowires. In the exemplary embodiment, each of the drain regions comprises the first semiconductor with the drain contact 232A coaxially wrapped completely around each of the drain regions filling in the gaps between the nanowires 210A, 210B. The source contact 232A is coaxially wrapped complete around source regions in substantially the same manner In an alternate embodiment, the first semiconductor material making up the nanowire 210A within the channel region 245A may be completely absent in the extrinsic drain region 235A. For such an embodiment, rather than alloying the second semiconductor materials 212A, 212B with the nanowire 210A, the nanowire 210A is selectively regrown within the extrinsic drain region 235A as a third semiconductor material, which in one embodiment is the same as the second semiconductor material 212A, and in another embodiment is a different semiconductor material altogether. As such, high bandgap semiconductors or diffusive elements such as Al, Ga, and Zn may be incorporated in the extrinsic drain region 235A to increase the bandgap of a group III semiconductor material present in this region (e.g., GaAs, InN, InAs, etc.). Where the regrown material is different than the second material, a multilayer structure may still be formed (e.g., where the regrown material still has a smaller band gap than that of the second semiconductor materials 212A, 212B). The second semiconductor materials 212A, 212B, being of a same crystal, may serve as seed layers to ensure the regrown semiconductor material is of sufficient crystal quality.

Figure 2B:
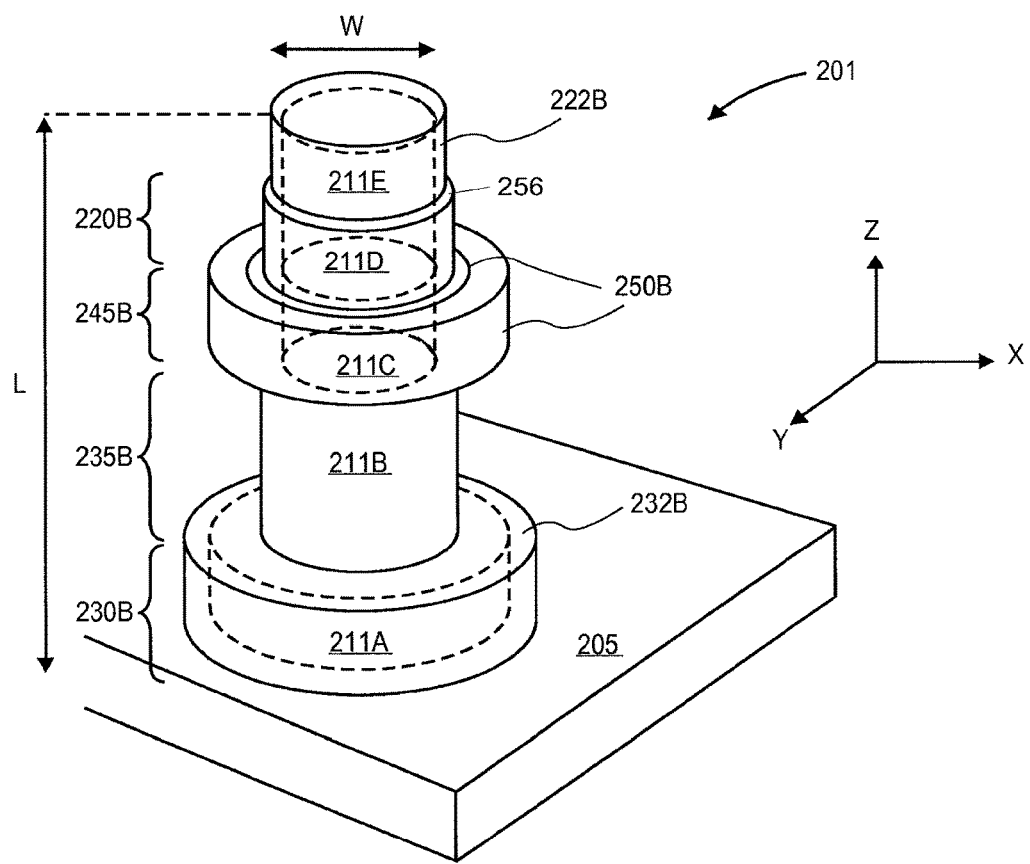
FIG. 2B is an isometric illustration of a non-planar high voltage transistor, in accordance with an embodiment.

FIG. 2B is an isometric illustration of a non-planar high voltage transistor 201, in accordance with an embodiment. For the high voltage transistor 201, a semiconductor nanowire is vertically oriented with respect to the substrate layer 205 so that the longitudinal length L is along the z dimension (orthogonal to substrate layer 205) and the width W defines an area of the substrate layer 205 occupied by the nanowire. As for the laterally oriented transistor 200, the high voltage transistor 201 comprises a plurality of different semiconductor material layers along the longitudinal length L with the first semiconductor material layer 211C in the channel region 245B providing a higher carrier mobility than the second semiconductor material layer 211B in the extrinsic drain region 235B (which has a higher bandgap than the first semiconductor material layer 211C). In the exemplary embodiment, the first and second semiconductor material layers 211C, 211B are part of an epitaxial stack.

For the transistor 201, epitaxial technology defines the various portions of the device. The epitaxial stack including at least the extrinsic drain region 235B and the channel region 245B may further include an epitaxial semiconductor layer of differing composition for each of the drain region 230B (layer 211A), extrinsic drain region 235B, channel region 245B, and source region 220B (layer 211D). Spacer dielectrics form bands of electrical insulation around the epitaxial regions of the nanowire to prevent shorting during fabrication. For example, spacer dielectric 256 surrounds the source region 220B so a regrown semiconductor 211E and/or ohmic metallization disposed thereon are spaced apart from the channel region 245B.

With the longitudinal length L sufficiently small, depending on the limits imposed by any lattice mismatch of the various materials in the epitaxial stack, the nanowire may be monocrystalline along the entire longitudinal length L, or at least up through the channel region 245B. It should also be noted that while the illustrative embodiment has the nanowire with the drain region 230B "down," on the substrate layer 205, other embodiments invert the nanowire about the channel region 245A to be "source down." In this form, the transistor 201 has critical dimensions, such as channel length and $L_{gd}$ (i.e., portions of the longitudinal length L), defined by epitaxial layer thickness, which can be very well-controlled (e.g., to 5-10 Å) by the growth process. Furthermore, with epitaxial layer growth defining lengths of the nanowire, material composition may be readily tailored to achieve the bandgap and mobility differentiation. Current drive can also be continuously scaled by lithographic patterning defining the cross-section of the nanowire.

Generally, the first and second semiconductor material layers 211C, 211B may be any of those described for the channel region 245A and extrinsic drain region 235A for transistor 200, respectively. In a particular embodiment, the extrinsic drain region 235B of the second semiconductor material layer 211B (e.g., SiC, SiGe, InAlAs, AlGaAs, GaN, etc.) while the channel region 245B of the first semiconductor material layer 211C (e.g., Si, Ge, InN, GaAs, InAs). For the transistor 201, group III-nitrides are particularly advantageous given the wide range of bandgap and mobility available with reasonably matched lattice parameters that allow the thickness of the extrinsic drain region to be 100 nm, or more, as needed for a given By. Although the extrinsic drain region 235B may in certain embodiments include a disordered multilayer structure including both the first and second semiconductor materials 211C, 211B (e.g., just as is utilized in the exemplary embodiment of the transistor 200), with the vertical nanowire orientation utilized in the transistor 201 it is relatively easy to selectively grow materials having the desired bandgap along different portions of the longitudinal length L. As with the transistor 200, the drain region 230B and source region 220B may be of the same semiconductor material as the channel region 245B, or a different epitaxial material. Also as described for the transistor 200, the source contact 222B may include a semiconductor 211E disposed on the source region 220B, such as a p+ tunneling layer and/or a highly doped (e.g., n+) low bandgap capping layer. A low resistivity ohmic contact metal may further be included in the source contact 222B.

Just as for the transistor 200, the transistor 201 includes a gate stack 250B coaxially wrapping completely around the nanowire within the channel region 245B. Similarly, the source and drain contacts 222B and 232B are also coaxially wrapping around the source and drain regions 220B, 230B, respectively. Between the gate stack 250B and drain region 230B a first dielectric spacer (not depicted) is disposed on the drain contact 232B and coaxially wraps completely around the extrinsic drain region 235B along a first longitudinal length. A second dielectric spacer is disposed on the gate stack 250B and coaxially wraps completely around the source region 220B along a second longitudinal length with the source contact 232B disposed on the second dielectric spacer.

Figure 3:
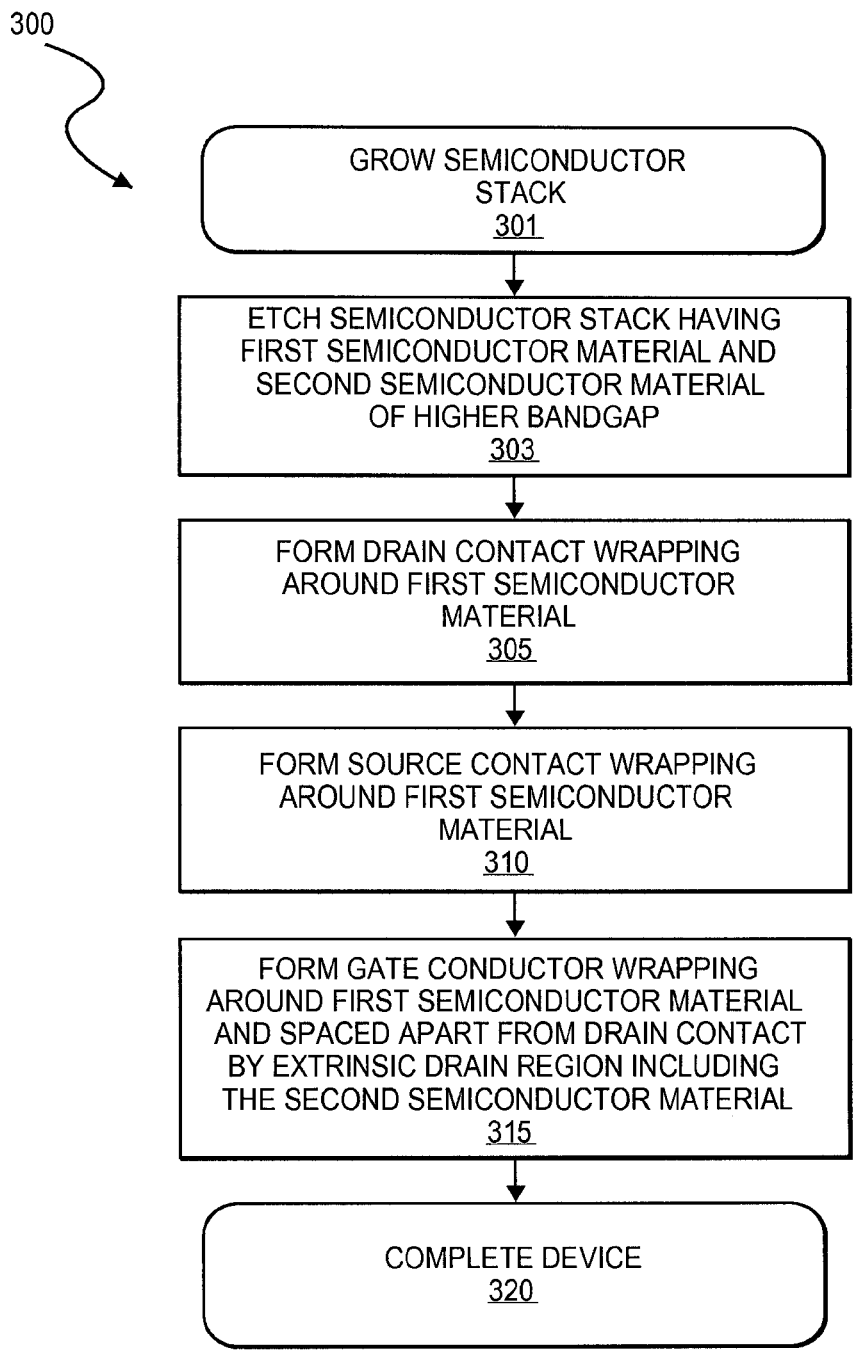
FIG. 3 is a flow diagram illustrating a method of fabricating a non-planar high voltage transistor, in accordance with an embodiment.

A brief description of salient portions of the fabrication process for each of the transistors 200 and 201 is now provided. FIG. 3 is a flow diagram illustrating a method 300 of fabricating the non-planar high voltage transistors 200 and 201, in accordance with an embodiment. While method 300 highlights salient operations, it is to be appreciated that each operation highlighted in FIG. 3 may entail many more process sequences, and no order is implied by the numbering of the operations or relative positioning of the operations in FIG. 3. FIGS. 4A, 4B, 4C, 4D and 4E are isometric illustrations of the non-planar high voltage transistor 200 fabricated in accordance with an embodiment of the method 300. FIGS. 5A, 5B, 5C, 5D, 5E, 5F, and 5G are isometric illustrations of the non-planar high voltage transistor 201 fabricated in accordance with an embodiment of the method 300.

Method 300 begins at operation 301 with epitaxially growing a stack of monocrystalline semiconductor materials on the substrate layer 205 using any standard chemical vapor deposition (CVD), molecular beam epitaxy (MBE), hydride vapor phase epitaxy (HVPE), or similar growth technique (with standard precursors, temperatures, etc.). At least a first semiconductor material and a second semiconductor material having a larger bandgap than that of the first semiconductor material is grown as part of the epitaxial stack.

At operation 303, a nanowire is defined (e.g., at least a width) by etching the epitaxial stack with any known plasma or wet chemical etch technique known in the art for the particular materials grown as part of the epitaxial stack. At operation 305, a drain contact is formed wrapping around a narrow bandgap semiconductor, such as the first semiconductor material. At operation 310, a source contact is coaxially wrapped completely around a narrow bandgap semiconductor, such as the first semiconductor material, along a longitudinal source length of the nanowire. At operation 315 a gate conductor is coaxially wrapped completely around the first semiconductor along a longitudinal channel length of the nanowire and spaced apart from the drain contact by an extrinsic drain region including the second semiconductor material. The device is then completed at operation 320, for example using conventional interconnect techniques.

Figure 4A:
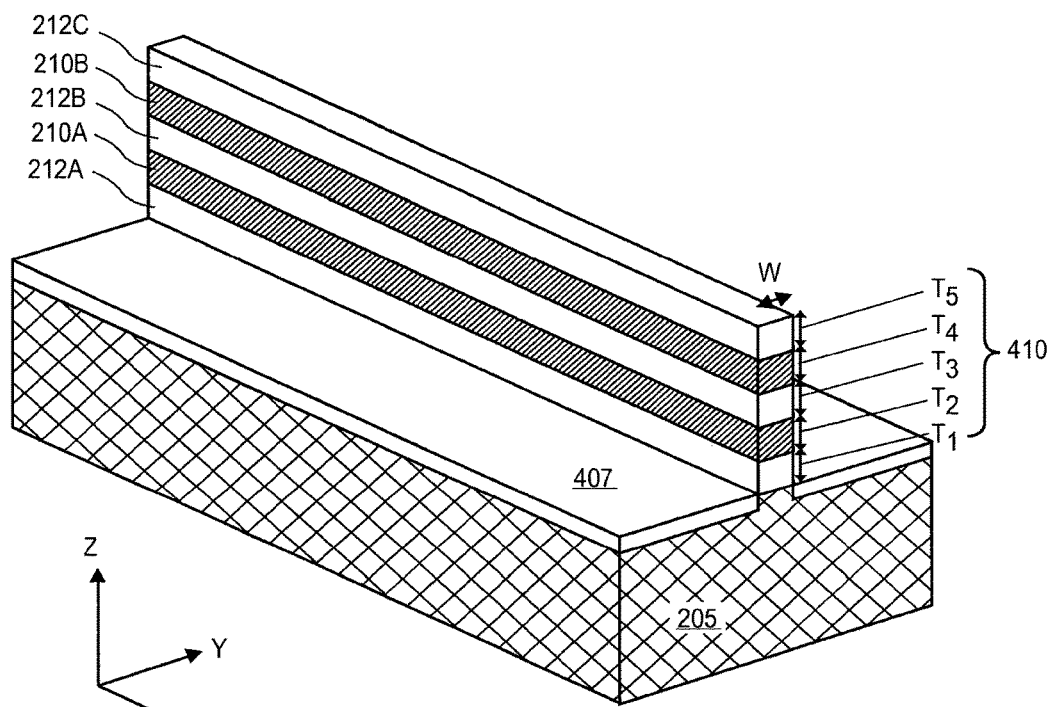
FIGS. 4A, 4B, 4C, 4D and 4E are isometric illustrations of a non-planar high voltage transistor fabricated in accordance with an embodiment of the method illustrated in FIG. 3.

As shown in FIG. 4A, in one embodiment of operation 303, a fin structure 410 having a width (W) is etched into an epitaxial stack of first semiconductor layers 210A, 210B alternating with second semiconductor layers 212A, 212B, 212C. As shown each of the first semiconductor layers 210A, 210B are disposed both above and below the second semiconductor layers 212A, 212B. The layer thicknesses, $T_1$-$T_5$ are dependent on the desired nanowire dimensions and also on the ability to backfill the thicknesses $T_1$, $T_3$ with the gate stack. The ability to backfill the thicknesses $T_2$, $T_4$ may also be relevant where the extrinsic drain region 235A includes a regrown nanowire material. Also shown in FIG. 4A, an insulator layer 407 is formed on either side of the fin structure 410 over the substrate layer 205, for example by a shallow trench isolation technique.

Figure 4B:
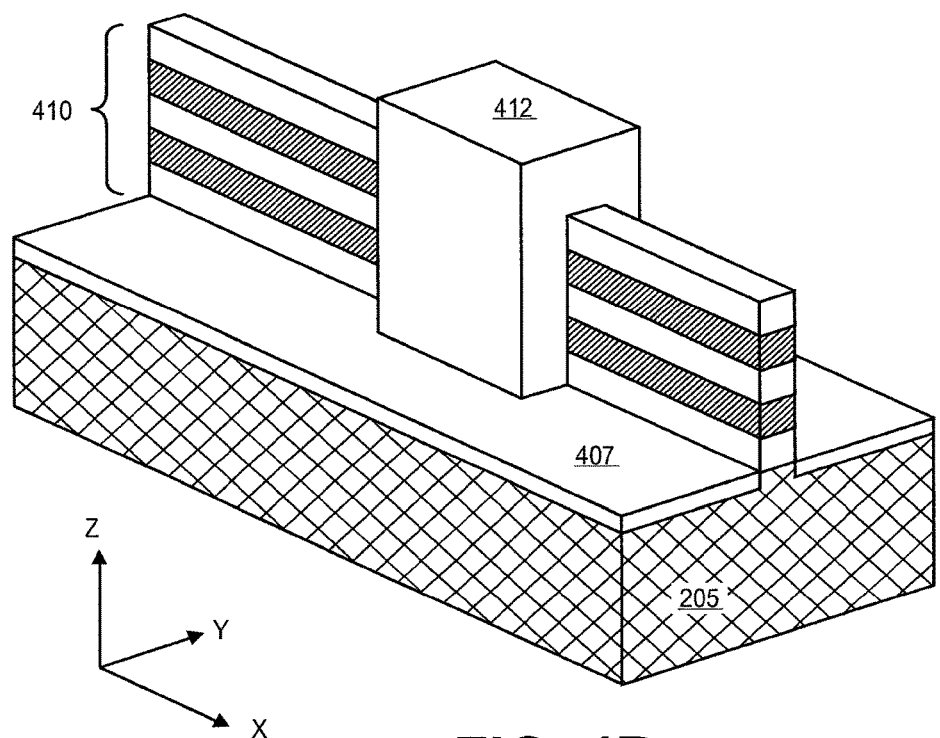
Figure 4C:
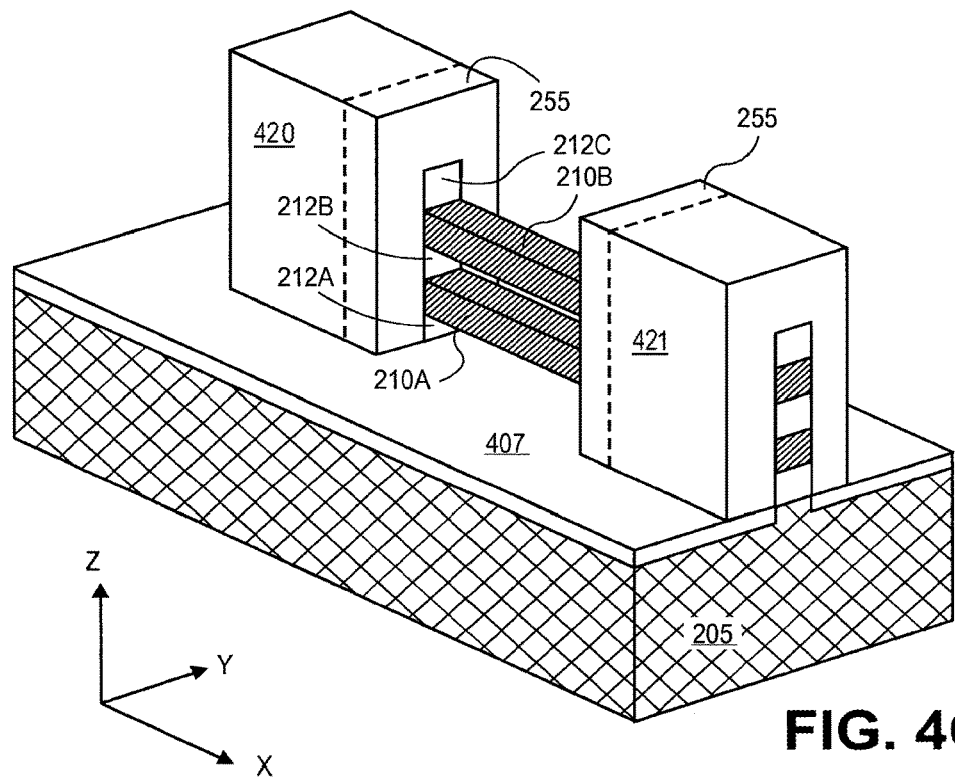

As shown in FIG. 4B, embodiments of operations 305, 310 and 315 entail forming a sacrificial gate 412 disposed on the fin structure 410. In one such embodiment, the sacrificial gate 412 is composed of a sacrificial gate oxide layer and a sacrificial polysilicon gate layer which are blanket deposited and patterned with a conventional lithographic and plasma etch process. Spacers may be formed on the sidewalls of the sacrificial gate 412 and an interlayer dielectric layer may be formed to cover the sacrificial gate 412. The interlayer dielectric layer may be polished to expose the sacrificial gate 412 for a replacement gate, or gate-last, process. Referring to FIG. 4C, the sacrificial gate 412 has been removed, leaving spacers 255 and portion of the interlayer dielectric layer (ILD) 420, 421. As further shown in FIG. 4C, the second semiconductor layers 212A, 212B, and 212C are removed in the channel region originally covered by the sacrificial gate 412. Discrete nanowires 210A and 210B of the first semiconductor material then remain.

Figure 4D:
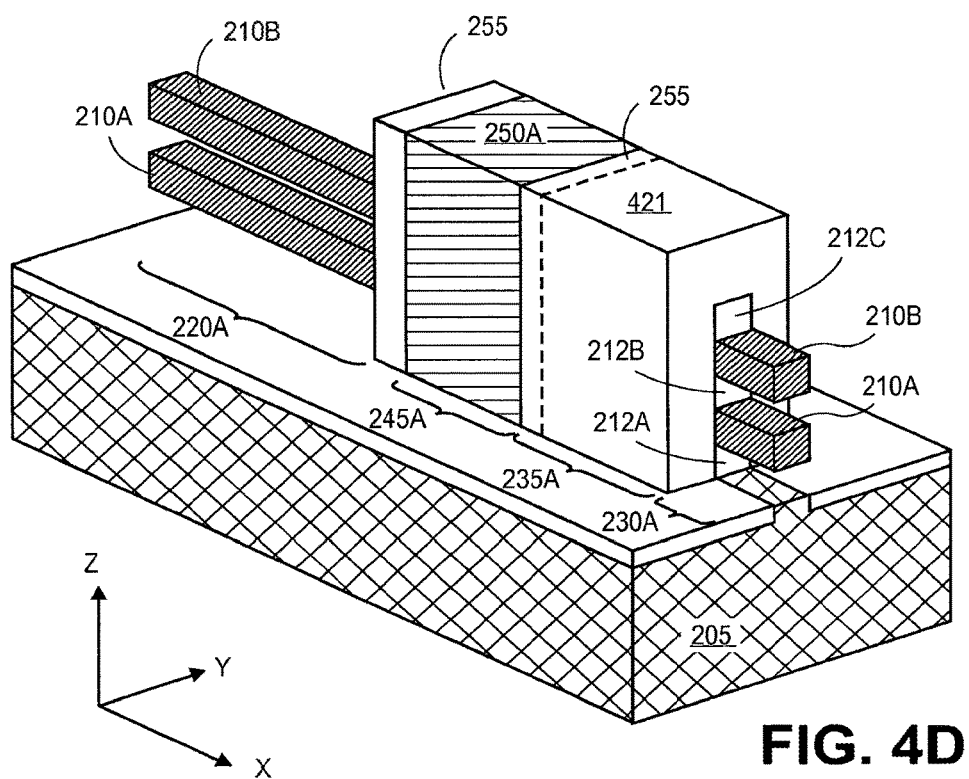

As shown in FIG. 4D, the gate stack 250A is then formed coaxially wrapping around the nanowires 210A, 210B within the channel region 245A. FIG. 4D illustrates the gate stack 250A following deposition of the gate dielectric and gate electrode materials to backfill a gap formed by selectively etching the second semiconductor material. That is, the gate stack 250A is formed in the trench between the interlayer dielectric layer 420, 421. Additionally, FIG. 4D depicts the result of the subsequent removal of the interlayer dielectric layer 420 after formation of the gate stack 250A. A portion of the interlayer dielectric layer 421 is retained (e.g., with a lithographically defined masked etch of the interlayer dielectric) within the extrinsic drain region 235A.

The portions of the second semiconductor layers 212A, 212B and 212C not protected by the gate stack 250A and the interlayer dielectric layer 421 are then removed selectively relative to the first semiconductor material to form a gap between the first semiconductor and the substrate layer 205. Discrete portions of the first semiconductor then remain in the source and drain regions 220A and 230A, as depicted in FIG. 4D. The source and drain contacts 222A, and 232A (as illustrated in FIG. 2A) may then be formed by backfilling the gaps formed within in the source and drain regions 220, 230. In one such embodiment, a contact metal is conformally deposited by CVD, atomic layer deposition (ALD), or metal reflow.

Figure 4E:
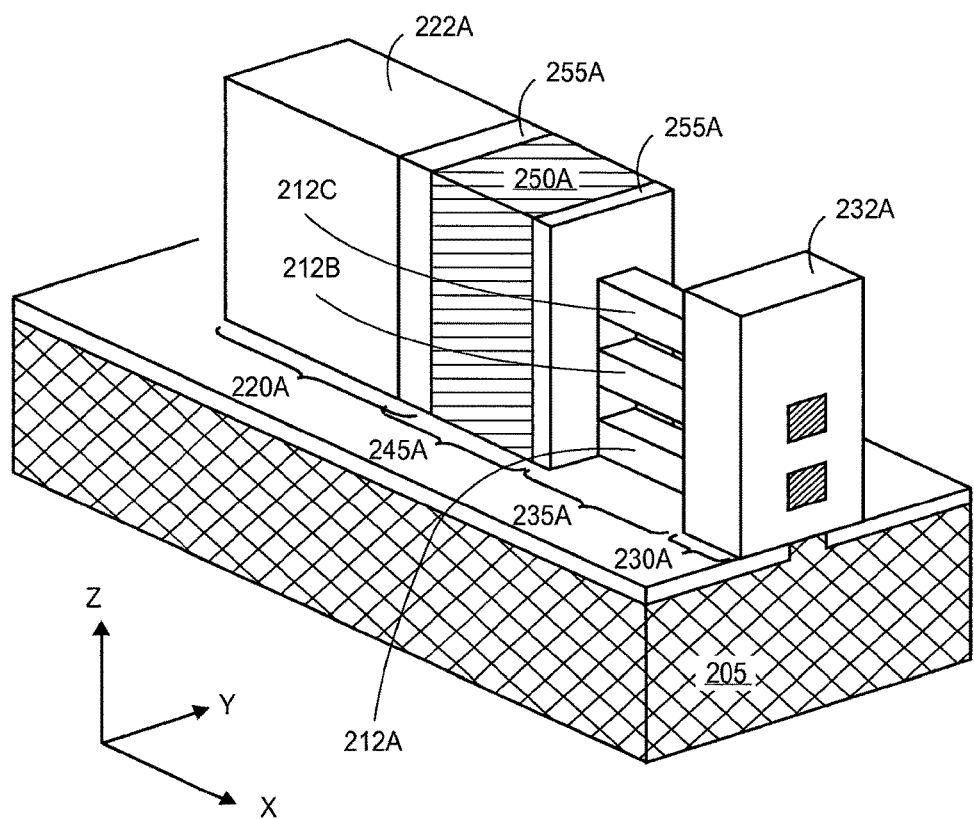

In one embodiment illustrated by FIG. 4E where alloying of the first and second semiconductors within the extrinsic drain region 235A is not desired, the remaining portion of the ILD 421 is removed selectively to the spacers 255A, gate stack 250A, and source, drain contacts 222A, 232A. The first semiconductor material 210A, 210B may then be removed selectively over to the second semiconductor material layer 212A, 212B, 212C to form a gap over (and under) the second semiconductor material. A crystalline semiconductor material that has a larger bandgap than at least the first semiconductor material 210A, 210B (and perhaps greater than the second semiconductor, as well) may then be epitaxially regrown in the gap. Alternatively, or in addition, diffusive elements such as Al, Ga, or Zn may be deposited on and incorporated into the first semiconductor 210A, 210B within the extrinsic drain region 235A after the remaining portion of the ILD 421 is removed.

In embodiments, to alloy the materials present within the extrinsic drain region 235A a thermal annealing is performed. For example, the first semiconductor material 210A, 210B and second semiconductor materials 212A, 212B, and 212C may be intermixed with thermal annealing of sufficient duration and temperature. Alternatively, the thermal annealing may intermix the first and/or second semiconductor material with the added diffusive elements (e.g., Al, Ga, or Zn). In one such embodiment, the thermal anneal is simultaneous with the growth of the source and drain contacts (e.g., operations 305 and 310).

Figure 5A:
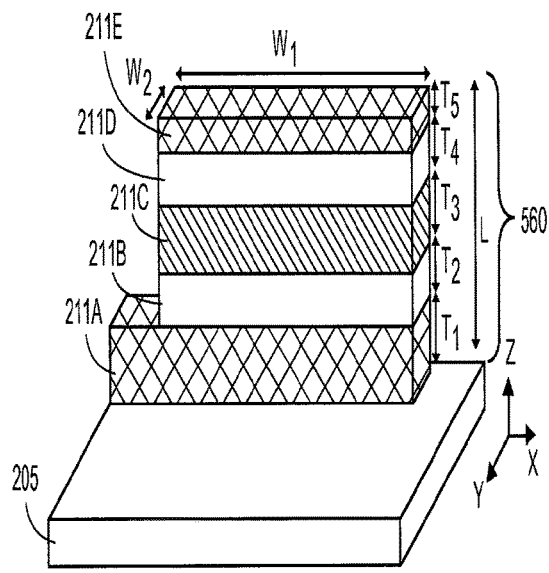
FIGS. 5A, 5B, 5C, 5D, 5E, 5F, 5G and 5H are isometric illustrations of a non-planar high voltage transistor fabricated in accordance with an embodiment of the method illustrated in FIG. 3.

As shown in FIG. 5A, another embodiment of operation 301 entails epitaxially growing on the substrate layer 205 semiconductor material layers tailored for each functional portion of the longitudinal length L, rather than the alternating layer structure of FIG. 4A. In the exemplary embodiment, a first layer 211A of the first semiconductor material with a high level of impurity, for example an n-type dopant, is grown to a thickness $T_1$. On the first layer 211A, a second layer 211B of the second semiconductor material and a low impurity level (e.g., n-type dopant) is epitaxially grown to a thickness $T_2$, selected to provide the desired high voltage capability (e.g., $L_{gd}$ for a BV of 10V). Next, a third layer 211C is epitaxially grown on the second layer to a thickness $T_3$. In the exemplary embodiment, the third layer 211C is of the first semiconductor material, but undoped for highest carrier mobility. The thickness $T_3$ is selected to provide the desired channel length ($L_g$). On the third layer 211C, a fourth layer 211D is epitaxially grown to a thickness $T_4$. In an embodiment, the fourth layer 211D is of the first semiconductor with a high impurity level (e.g., n-type dopant). An intervening lightly doped layer may also be provided for an extrinsic source region (not depicted). In the exemplary embodiment, a fifth layer 211E is epitaxially grown to a thickness $T_5$. The fifth layer 211E may be a graded layer to reduce contact resistance or, in the exemplary embodiment is a p+ impurity doped layer of the first semiconductor forming a tunnel junction.

Figure 5B:
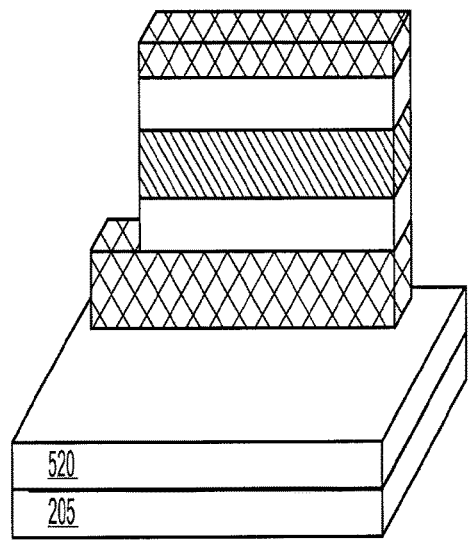
Figure 5C:
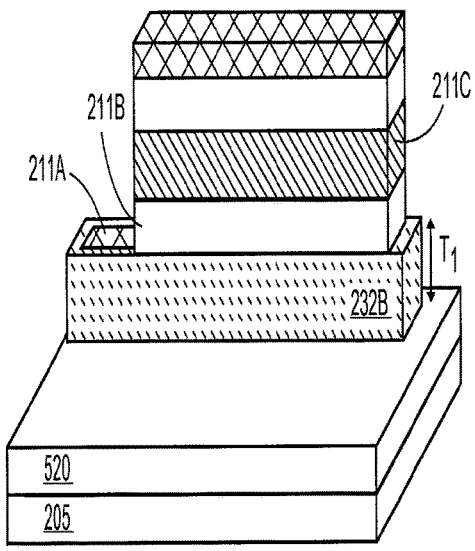

As further shown in FIG. 5A, operation 303 entails etching a vertical nanowire 560 of width $W_1$ and $W_2$ into the epitaxial stack. Widths $W_1$ and $W_2$ differ significantly from FIG. 2B merely to illustrate how the nanowire dimensions may vary considerably, depending on implementation. As shown, the layers 211E, 211D, 211C, and 211B are etched with a same mask and a larger second mask is overlayed and the first layer 211A etched to include a contact landing. As also shown in FIG. 5B, an isolation layer 520 is formed on the substrate layer 205 and around the nanowire 560. As illustrated in FIG. 5C, the drain contact 232B is formed around the first layer 211A. For example, a metal may be deposited over the nanowire 560 and etched anisotropically (e.g., a metal spacer etch) to recess the metal to a height on the nanowire sidewall that is approximately equal to, or slightly less, than the thickness $T_1$.

Figure 5D:
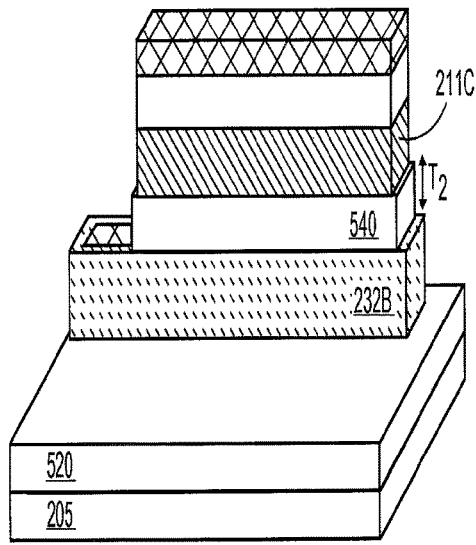

As shown in FIG. 5D, operation 305 entails depositing a dielectric material on the nanowire 560 and on the drain contact 232B. The dielectric material is then anisotropically etched to form a first dielectric spacer 540 surrounding the nanowire 560. The first dielectric spacer 540 is disposed on the drain contact 232B and has a height approximately equal to the thickness of the second epitaxial layer 211B.

Figure 5E:
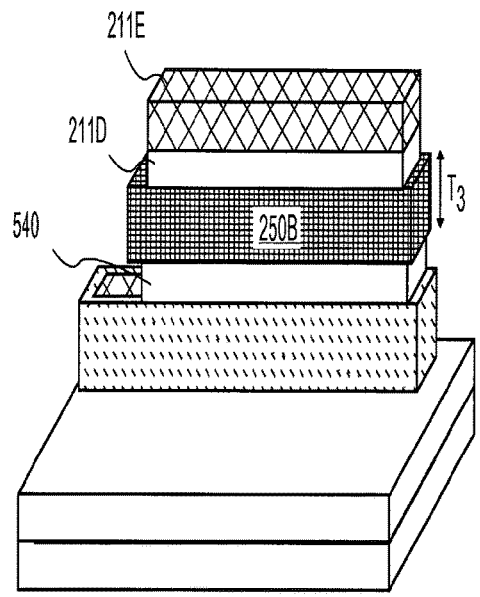

As shown in FIG. 5E, an embodiment of operation 315 entails depositing the gate insulator over the nanowire 560 and on the first dielectric spacer 540. The gate conductor is furthermore deposited on the gate insulator and at least the gate conductor is anisotropically etched to form a gate conductor spacer surrounding the nanowire 560 that is to function as the gate stack 250B. The gate conductor is recessed down the longitudinal length L with the anisotropic etch to have a height approximately equal to $T_3$. A masked portion (not depicted) may be utilized to provide a gate contact in a plane orthogonal to the longitudinal length L of the nanowire 560. The gate insulator not protected by the gate conductor spacer is then etched to expose the fourth semiconductor layer 211D.

Figure 5F:
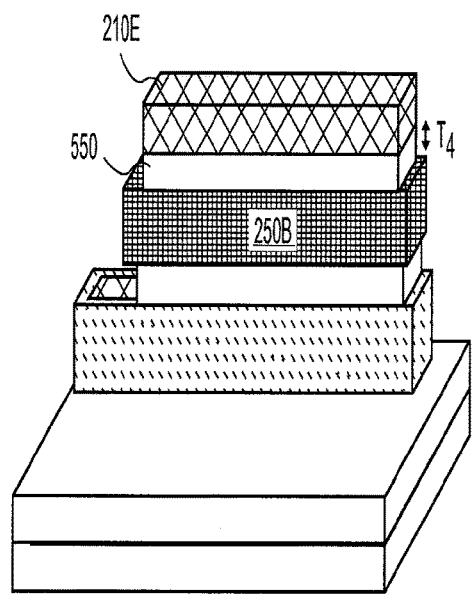
Figure 5G:
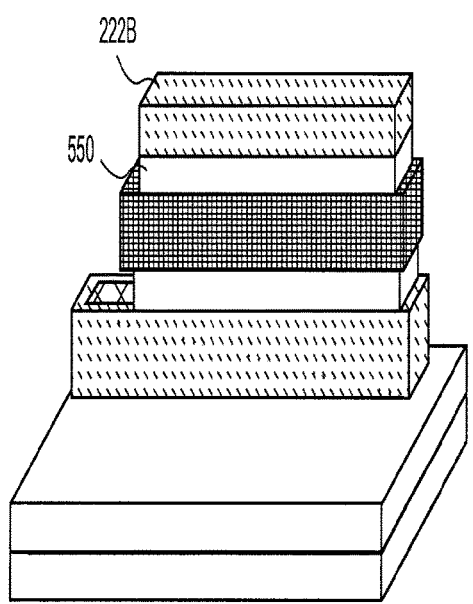
Figure 5H:
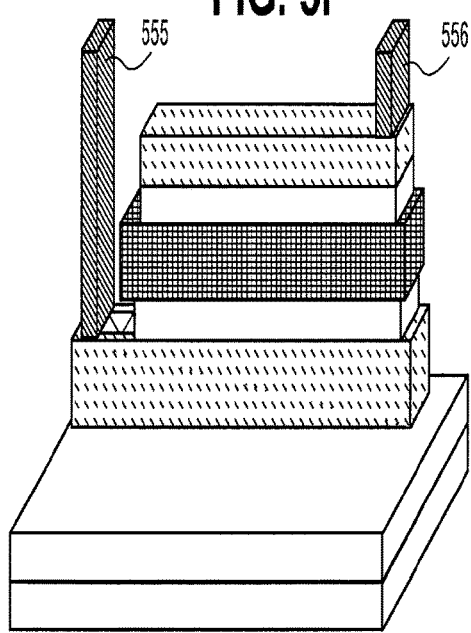

As shown in FIG. 5F, at embodiment of operation 310 entails depositing a dielectric material on the nanowire 560 and on the gate stack 250B (i.e., on the gate conductor spacer). The dielectric material is anisotropically etched to form a second dielectric material spacer 550 surrounding the nanowire 560 and disposed on the gate stack. The second dielectric material spacer 550 is recess etched to a height less than $T_4$. As illustrated in FIG. 5G, the source contact 222B is then formed on the nanowire 560 and on the second dielectric material spacer 550. Then, as shown in FIG. 5H, operation 320 begins with formation of the drain and source vias 555, 556.

Figure 6:
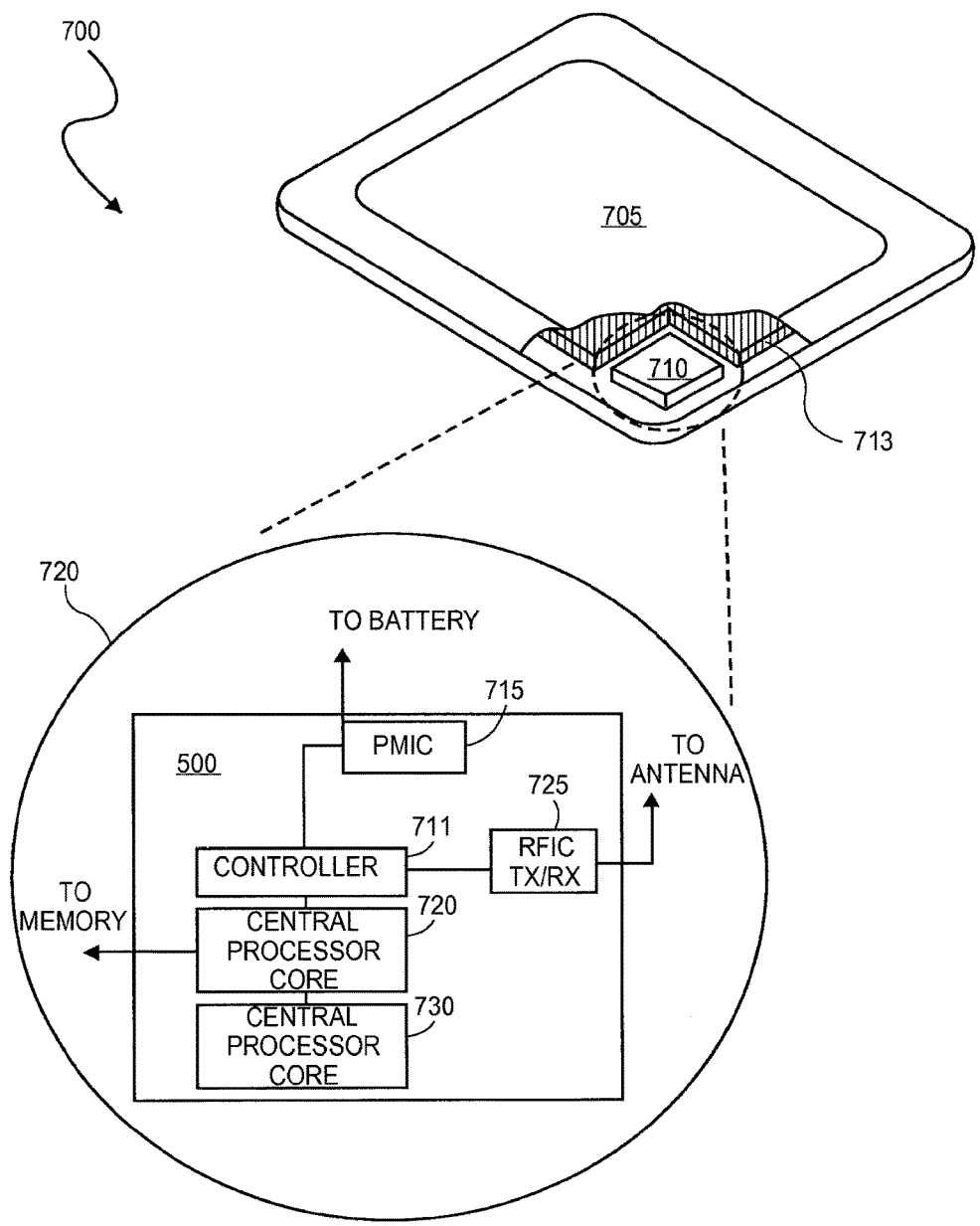
FIG. 6 is a functional block diagram of an SOC implementation of a mobile computing platform, in accordance with an embodiment of the present invention.

FIG. 6 is a functional block diagram of a SOC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705, that is in the exemplary embodiment a touchscreen (e.g., capacitive, inductive, resistive, etc.) permitting the receipt of user input, the SOC 710, and a battery 713. As illustrated, the greater the level of integration of the SOC 710, the more of the form factor within the mobile computing platform 700 that may be occupied by the battery 713 for longest operative lifetimes between charging, or occupied by memory (not depicted), such as a solid state drive for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SOC 710 is further illustrated in the expanded view 720. Depending on the embodiment, the SOC 710 includes a portion of a substrate 500 (i.e., a chip) upon which two or more of a power management integrated circuit (PMIC) 715, RF integrated circuit (RFIC) 725 including an RF transmitter and/or receiver, a controller thereof 711, and one or more central processor core 720, 730 is fabricated. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 700 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 715 and RFIC 725, which typically utilize LDMOS and III-V HBT or HEMT technologies, respectively. In embodiments of the present invention however, the PMIC 715 and RFIC 725 employ the high voltage transistors described herein (e.g., high voltage transistor 200). In further embodiments the PMIC 715 and RFIC 725 employing the high voltage transistors described herein are integrated with one or more of the controller 711 and processor cores 720, 730 provided in silicon CMOS technology monolithically integrated with the PMIC 715 and/or RFIC 725 onto the substrate 500. It will be appreciated that within the PMIC 715 and/or RFIC 725, the high voltage, high frequency capable transistors described herein need not be utilized in exclusion to CMOS, but rather silicon CMOS may further be included in each of the PMIC 715 and RFIC 725. For example, where the high voltage transistor 200 employs a silicon channel region and a SiC extrinsic drain region, a non-planar CMOS transistor may be fabricated substantially as shown in FIGS. 4A-4E with the exception that all of the ILD 421 is removed rather than protected (masked).

The high voltage transistors described herein may be specifically utilized where a high voltage swing is present (e.g., battery power regulation, DC-to-DC conversion, etc. within the PMIC 715). For illustration, battery voltage in a smartphone typically ranges from 3-5V. However, transistors described herein are able to sustain 2-3 times that voltage range (i.e. 7-10V at least) to operate with sufficient margin to ensure reliable operation. As illustrated, in the exemplary embodiment the PMIC 715 has an input coupled to the battery 713 and has an output to provide a current supply to all the other functional modules in the SOC 710. In a further embodiment, where additional ICs are provided within the mobile computing platform 700 but off the SOC 710, the PMIC 715 output further provides a current supply to all these additional ICs off the SOC 710. As further illustrated, in the exemplary embodiment the RFIC 715 has an output coupled to an antenna and may further have an input coupled to a communication modules on the SOC 710, such as an RF analog and digital baseband module (not depicted). Alternatively, such communication modules may be provided on an IC off-chip from the SOC 710 and coupled into the SOC 710 for transmission. Depending on the first semiconductor material utilized, the high voltage transistors described herein (e.g., 200 or 201) may further provide the large power added efficiency (PAE) needed from a power amplifier transistor having an $F_t$ (cut-off frequency at 0 dB current gain) of at least ten times carrier frequency (e.g., a 1.9 GHz in an RFIC 725 designed for 3G or GSM cellular communication), or >20 GHz. With the low $R_{on}$ achieved by the transistors described herein, $F_{max}$ of over 20 GHz may also be achieved simultaneously with the $F_t$ over 20 GHz and a BV of at least 7-10V.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A vertical transistor, comprising:
   a cylindrical source region on and in direct contact with an uppermost surface of a substrate, the cylindrical source region having a center with an axis orthogonal to the uppermost surface of the substrate;
   a cylindrical channel region above the cylindrical source region, the cylindrical channel region having a center co-axial with the axis;
   a cylindrical extrinsic drain region above the cylindrical channel region, the cylindrical extrinsic drain region having a center co-axial with the axis;
   a cylindrical drain region above the cylindrical extrinsic drain region, the cylindrical drain region having a center co-axial with the axis;
   a gate stack comprising a gate insulator and a gate conductor coaxially wrapped completely around the cylindrical channel region;
   a source contact coaxially wrapped completely around the cylindrical source region, the source contact in contact with the uppermost surface of the substrate; and
   a drain contact coaxially wrapped completely around at least a portion of the cylindrical drain region.

2. The transistor of claim 1, wherein the cylindrical extrinsic drain region has a band gap greater than a band gap of the cylindrical channel region.

3. The transistor of claim 1, wherein the source contact is spaced apart from the cylindrical channel region by a first length, and wherein the drain contact is spaced apart from the cylindrical channel region by a second length greater than the first length.

4. The transistor of claim 1, wherein the cylindrical drain region, the cylindrical channel region, and the cylindrical source region comprise a first semiconductor material, and the cylindrical extrinsic drain region comprises a second semiconductor material different than the first semiconductor material.

5. The transistor of claim 4, wherein the first semiconductor material is InN and the second semiconductor material is GaN.

6. The transistor of claim 4, wherein the first semiconductor material is GaAs and the second semiconductor material is AlGaAs.

7. The transistor of claim 4, wherein the first semiconductor material is InAs and the second semiconductor material is InAlAs.

8. The transistor of claim 4, wherein the first semiconductor material is Ge and the second semiconductor material is Si.

9. A vertical transistor, comprising:
   a cylindrical drain region on and in direct contact with an uppermost surface of a substrate, the cylindrical drain region having a center with an axis orthogonal to the uppermost surface of the substrate;
   a cylindrical extrinsic drain region above the cylindrical drain region, the cylindrical extrinsic drain region having a center co-axial with the axis;
   a cylindrical channel region above the cylindrical extrinsic drain region, the cylindrical channel region having a center co-axial with the axis;
   a cylindrical source region above the cylindrical channel region, the cylindrical source region having a center co-axial with the axis;
   a gate stack comprising a gate insulator and a gate conductor coaxially wrapped completely around the cylindrical channel region;
   a drain contact coaxially wrapped completely around the cylindrical drain region, the drain contact in contact with the uppermost surface of the substrate; and
   a source contact coaxially wrapped completely around at least a portion of the cylindrical source region.

10. The transistor of claim 9, wherein the cylindrical extrinsic drain region has a band gap greater than a band gap of the cylindrical channel region.

11. The transistor of claim 9, wherein the source contact is spaced apart from the cylindrical channel region by a first length, and wherein the drain contact is spaced apart from the cylindrical channel region by a second length greater than the first length.

12. The transistor of claim 9, wherein the cylindrical drain region, the cylindrical channel region, and the cylindrical source region comprise a first semiconductor material, and the cylindrical extrinsic drain region comprises a second semiconductor material different than the first semiconductor material.

13. The transistor of claim 12, wherein the first semiconductor material is InN and the second semiconductor material is GaN.

14. The transistor of claim 12, wherein the first semiconductor material is GaAs and the second semiconductor material is AlGaAs.

15. The transistor of claim 12, wherein the first semiconductor material is InAs and the second semiconductor material is InAlAs.

16. The transistor of claim 12, wherein the first semiconductor material is Ge and the second semiconductor material is Si.

17. A method of fabricating a vertical transistor, the method comprising:
   epitaxially growing a cylindrical first source/drain region directly on an uppermost surface of a substrate, the cylindrical first source/drain region having a center with an axis orthogonal to the uppermost surface of the substrate;

forming a first source/drain contact coaxially wrapped completely around the cylindrical first source/drain region, the first source/drain contact in contact with the uppermost surface of the substrate;

epitaxially growing a cylindrical channel region above the cylindrical first source/drain region, the cylindrical channel region having a center co-axial with the axis;

forming a gate stack comprising a gate insulator and a gate conductor coaxially wrapped completely around the cylindrical channel region;

epitaxially growing a cylindrical second source/drain region above the cylindrical channel region, the cylindrical second source/drain region having a center co-axial with the axis; and forming a second source/drain contact coaxially wrapped completely around at least a portion of the cylindrical second source/drain region; and epitaxially growing a cylindrical extrinsic drain region between the cylindrical first source/drain region and the cylindrical channel region or between the cylindrical second source/drain region and the cylindrical channel region, the cylindrical extrinsic drain region having a center co-axial with the axis.

18. The method of claim 17, wherein the cylindrical extrinsic drain region has a band gap greater than a band gap of the cylindrical channel region.

19. The method of claim 17, wherein the first source/drain contact is spaced apart from the cylindrical channel region by a first length, and wherein the second source/drain contact is spaced apart from the cylindrical channel region by a second length greater than the first length.

20. The method of claim 17, wherein the second source/drain contact is spaced apart from the cylindrical channel region by a first length, and wherein the first source/drain contact is spaced apart from the cylindrical channel region by a second length greater than the first length.

21. The method of claim 17, wherein the cylindrical first source/drain region, the cylindrical channel region, and the cylindrical second source/drain region comprise a first semiconductor material, and the cylindrical extrinsic drain region comprises a second semiconductor material different than the first semiconductor material.

22. The method of claim 21, wherein the first semiconductor material is InN and the second semiconductor material is GaN.

23. The method of claim 21, wherein the first semiconductor material is GaAs and the second semiconductor material is AlGaAs.

24. The method of claim 21, wherein the first semiconductor material is InAs and the second semiconductor material is InAlAs.

25. The method of claim 21, wherein the first semiconductor material is Ge and the second semiconductor material is Si.

* * * * *